(12) United States Patent
Youngquist et al.

(10) Patent No.: US 6,549,179 B2
(45) Date of Patent: Apr. 15, 2003

(54) LED DISPLAY ASSEMBLY

(75) Inventors: John S. Youngquist, 899 Niagra Pkwy., Fort Erie (CA), L2A 5M4; John W. Toulmin, Fort Erie (CA)

(73) Assignee: John S. Youngquist, Ontario (CA)

( * ) Notice: Subject to any disclaimer, the term of this patent is extended or adjusted under 35 U.S.C. 154(b) by 0 days.

(21) Appl. No.: 09/859,519

(22) Filed: May 18, 2001

(65) Prior Publication Data

US 2001/0022564 A1 Sep. 20, 2001

Related U.S. Application Data

(62) Division of application No. 09/122,713, filed on Jul. 27, 1998.

(51) Int. Cl.[7] .................................................. G09G 3/14
(52) U.S. Cl. ............................. 345/39; 345/33; 345/34; 345/46; 345/82; 345/83; 345/695; 313/500; 313/498; 368/241; 349/142; 349/146; 347/245; 340/815.4; 340/815.44; 340/815.45
(58) Field of Search ............................... 345/33–35, 39, 345/43, 46, 82, 83; 362/800; 313/498, 500; 368/241; 257/676; 347/245; 349/142–146; 340/815.45

(56) References Cited

U.S. PATENT DOCUMENTS

| | | | |
|---|---|---|---|
| 3,914,786 A | | 10/1975 | Grossi |
| 4,105,297 A | * | 8/1978 | Shimizu ..................... 349/142 |
| 4,654,652 A | * | 3/1987 | Cerruti ......................... 345/33 |
| 4,811,003 A | * | 3/1989 | Strathman et al. ............. 345/88 |
| 4,935,856 A | | 6/1990 | Dragoon |
| 5,404,282 A | | 4/1995 | Klinke et al. |
| 5,432,358 A | | 7/1995 | Nelson et al. |
| 5,564,819 A | | 10/1996 | Yamaguchi |
| 5,699,073 A | | 12/1997 | Lebby et al. |
| 5,801,800 A | | 9/1998 | Wright et al. |
| 5,808,592 A | | 9/1998 | Mizutani et al. |
| 5,812,102 A | | 9/1998 | Sprole, Jr. et al. |
| 5,818,404 A | | 10/1998 | Lebby et al. |
| 5,831,699 A | | 11/1998 | Wright et al. |
| 5,835,269 A | | 11/1998 | Natori |
| 5,857,767 A | | 1/1999 | Hochstein |
| 5,892,491 A | | 4/1999 | Fukatsu |
| 5,938,312 A | | 8/1999 | Ishinaga |
| 5,990,802 A | | 11/1999 | Maskeny |
| 6,188,052 B1 | * | 2/2001 | Trucco ....................... 219/603 |
| 6,307,527 B1 | * | 10/2001 | Youngquist et al. .......... 345/39 |

OTHER PUBLICATIONS

Product Specification Sheet for SURFEE–LEDS® by Lumex Opto/Components Inc., Prior to 1998.

* cited by examiner

*Primary Examiner*—Henry N. Tran
(74) *Attorney, Agent, or Firm*—Nixon & Vanderhye PC

(57) ABSTRACT

Surface mounted LEDs are arrayed in special patterns to provide a relatively high resolution dot-matrix visual display and/or multi-segment character displays. Especially abbreviated solder bonding pads are utilized to obtain a higher density packing of the surface mounted arrays in at least some embodiments. Special anti-glare coatings and structures are employed to reduce ambient light reflections for aircraft instrument applications. Multi-colored display outputs are also provided.

13 Claims, 7 Drawing Sheets

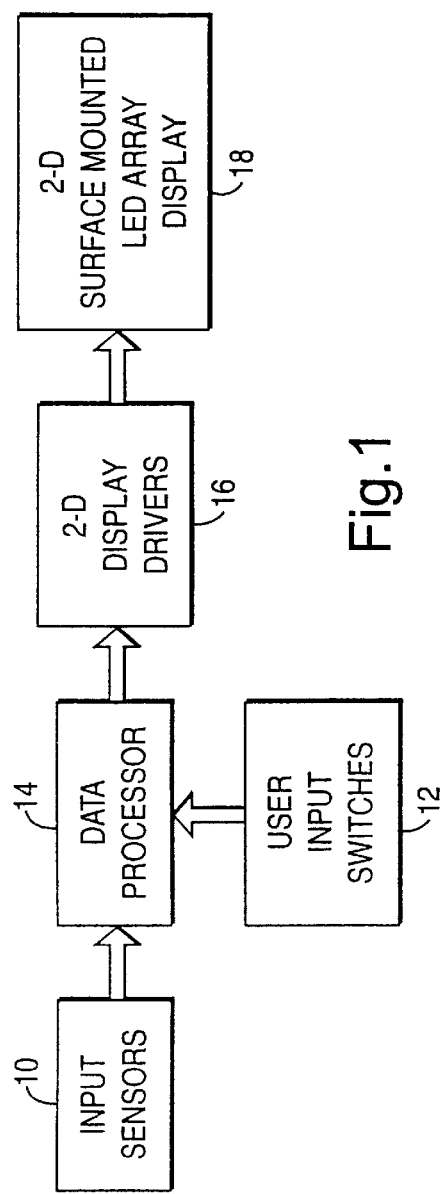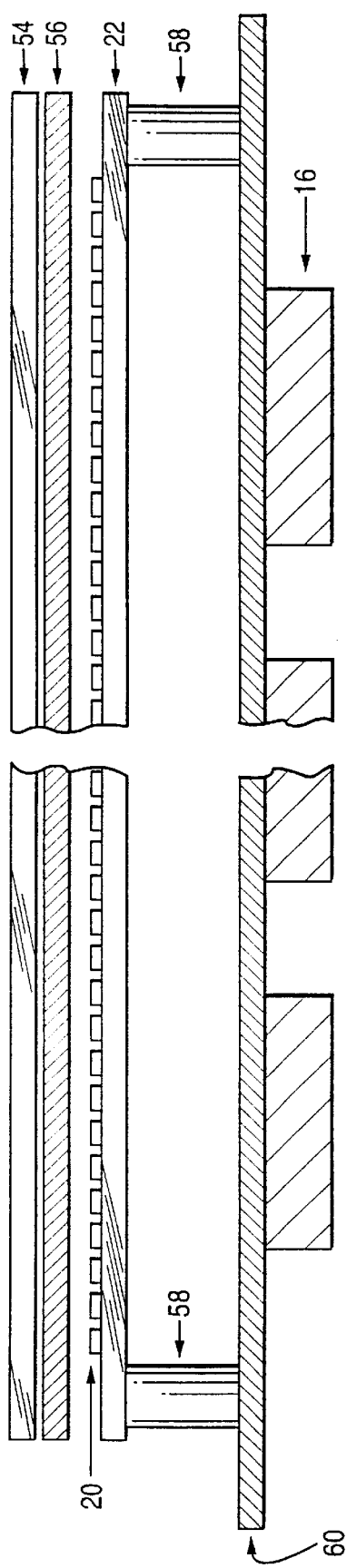

LED DISPLAY ASSEMBLY

RELATED APPLICATION

This is a divisional application of parent application Ser. No. 09/122,713 filed Jul. 27, 1998.

BACKGROUND OF THE INVENTION

1. Field of the Invention

This invention relates to a two-dimensional visual display of light-emitting diodes to create dot-matrix, segmented character, bargraph and/or annunciator visual displays. Such displays are especially suited for the visual display output of aircraft instruments in the cockpit of aircraft.

2. Related Art

Visual aircraft instrument displays have previously included light-emitting diodes (e.g., for annunciator light outputs). However, a prior dot-matrix display for the STRIKEFINDER® atmospheric electrical discharge detector and display available from Insight Avionics Inc., uses a gas plasma display which has barely adequate brightness and a limited life. Other competitive instruments have used expensive CRT displays to obtain sufficient dot-matrix resolution.

A surface mounted light-emitting diode (LED) is also known and readily available commercially (e.g., from Lumex Corporation) with various different emitted colors of light (e.g., green, yellow, super yellow, red and super red). LED arrays have been made by applying chips to ceramic substrates and using wire bonding connections which are not too practical since microscopic bond wires are fragile and single chips are difficult to replace. However, conventional surface mounting techniques require a minimum sized surface bonding solder pad that extends beyond the edges of the surface mounted component by at least about 0.010 inch. For example, the recommended LED surface mount solder pad layout by Lumex Corporation would have solder pads extending outwardly end-to-end by 0.090 inch—for a surface mounted LED that is only 0.063 inch in total length (thus leaving 0.0135 inch of solder pad extending at each end beyond the LED itself). Such extended bonding solder pad layouts have conventionally been considered necessary so as to provide sufficient liquid solder meniscus to accurately center the surface mounted component at the desired location and/or for other reasons.

Perhaps for such reasons as these, it is not believed that surface mounted LEDs have previously been used to realize relatively dense dot-matrix or segmented character visual displays. SUMMARY OF THE INVENTION This invention utilizes a discovery that one can use substantially less than 0.010 inch excess solder pad dimensions placed with conventional surface mounting machinery (with appropriate cautionary steps being taken to prevent undesired solder flow through solder pad connection vias) to obtain relatively dense two-dimensional visual display of light-emitting diodes surface mounted on a printed circuit board. Each diode provides a dot of output light when activated and the diodes can be disposed in relatively densely packed two-dimensional row and column arrays.

In some exemplary embodiments, the printed circuit board is substantially planar and each pair of conductive mounting pads is connected through corresponding anode and cathode vias to different respectively corresponding printed conductive circuit anode and cathode row/column connections in different printed circuit board planes (substantially parallel to the printed circuit board on which the diodes are mounted).

If the two-dimensional visual display is to provide a dense dot-matrix display with equal vertical and horizontal spacing of output light dots, then the oblong-dimensioned light-emitting diodes are preferably oriented differently in adjacent rows and columns of the arrays. In particular, a preferred embodiment utilizes a herringbone pattern of rectangularly-shaped light-emitting diodes such that the diodes of one row or column are oriented orthogonally with respect to the diodes in another adjacent row or column. In this embodiment, the rows and columns of light-emitting portions of the diodes are offset with respect to one another in adjacent rows and columns.

In the preferred exemplary embodiments having the most dense packing of light-emitting diodes, it is preferred that the conductive pads extend beyond the end edges of the light-emitting diodes by a distance substantially less than 0.010 inch (i.e., the conventional minimum extension). In particular, in preferred exemplary embodiments, the extension distance of the solder pads is only approximately 0.001 inch. In this arrangement where the diodes have an oblong (e.g., rectangular) shape with a long dimension D, they are arrayed so as to have a spacing P between diode light dot outputs that is substantially less than D in both row and column directions.

In one exemplary embodiment, the two-dimensional visual display as previously discussed is incorporated within an assembly of successively stacked substantially planar elements including an optical lens/graticule layer, a light polarizing filter layer, the light-emitting diode array on its multi-layered printed circuit board having row and column connection points at its periphery, and a driver printed circuit board connected to the peripheral connection points of the diode array through connections disposed within at least one spacer structure and having integrated circuit LED drivers on the driver printed circuit board.

In one exemplary embodiment, the apparatus is associated with a data processor having input sensors for sensing electrical discharges in the atmosphere and outputting signals to the driver printed circuit board so as to produce a plan view on a dot-matrix visual display of detected electrical atmospheric discharges (e.g., lightning strikes). Such a system is available, for instance, from Insight Avionics Inc. marketed under the trademark STRIKEFINDER®.

Preferably the surface mounted LED array is coated directly with an anti-reflective coating (e.g., a $\lambda/4$ thickness so as to reduce ambient light-reflections from aircraft instrument display. Concurrent use of an overlayed circularly polarized sheet is also preferred to further reduce ambient light reflections.

Another embodiment of this invention is preferably utilized as part of a graphic engine monitor (GEM) which provides bargraphs and/or alphanumeric data related to real time aircraft engine conditions (e.g., the cylinder head and/or exhaust gas temperature for each cylinder of a multi-cylinder aircraft engine, the turbine inlet temperature of a turbo charger, etc.). For this exemplary application, a two-dimensional visual display in accordance with the invention is disposed under a multi-apertured mask representing a segmented character display (e.g., including seven-segment apertures corresponding to the conventional seven-segment character displays). Preferably in the exemplary embodiment, each diode is associated with a given segment of the character display and all diodes for one character can be simultaneously activated (e.g., together with a column of LEDs representing a bargraph or the like).

In the exemplary embodiment of a segmented character display in accordance with this invention, each diode has an oblong (e.g., rectangular) shape with the long dimension being oriented at a substantial slant angle with respect to both horizontal and vertical character dimensions. For example, in the exemplary embodiment, the slant angle is substantially 45°. In this exemplary embodiment, the seven-segment character mask is associated with seven diodes having such oblong shape and arrayed vertically (at the substantial slant angle) in stacked linear groups of two, three and two. If desired, a further diode can be included with the middle linear slanted group of three diodes and associated with a decimal point aperture in the mask located at the lower left portion of the character.

The two dimensional visual display of this invention may also utilize adjacent light-emitting diodes having different colors of emitted light which are connected for selective activation so as to provide different colors of light output for a given display element (e.g., a bargraph). The adjacent differently colored light outputs may also be co-activated so as to provide light output as a mixture of colors from plural light-emitting diodes.

BRIEF DESCRIPTION OF THE DRAWINGS

These as well as other objects and advantages of this invention will be more completely understood in conjunction with the following detailed description of exemplary embodiments taken in conjunction with the accompanying drawings, of which:

FIG. 1 is a general block diagram of exemplary apparatus incorporating the two-dimensional surface mounted LED array of this invention;

FIG. 5 is a cross-sectional depiction of an exemplary LED display assembly utilizing this invention;

DETAILED DESCRIPTION OF EXEMPLARY EMBODIMENTS

Figure 2:
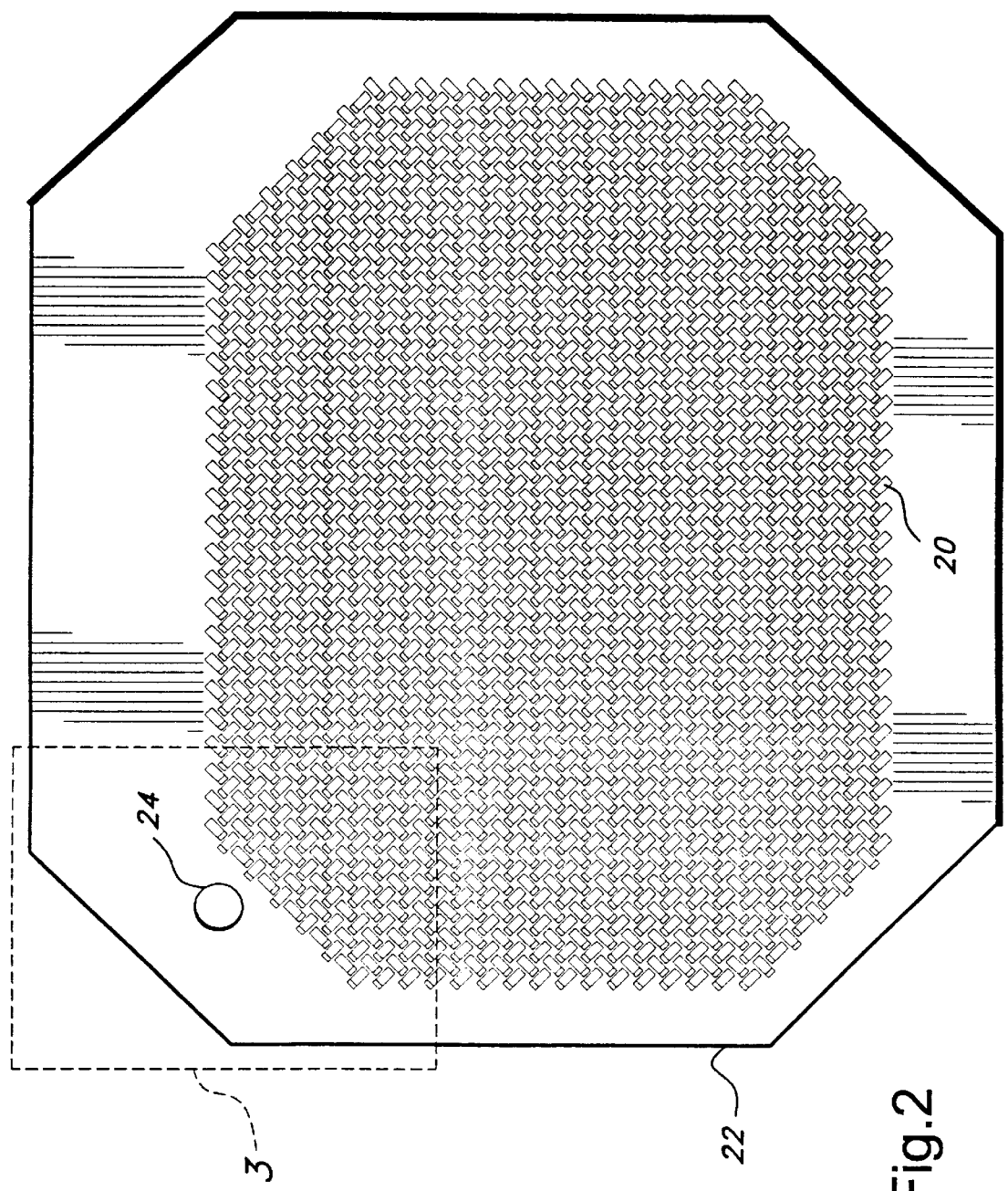
FIG. 2 is a front view of a two-dimensional array of surface mounted LEDs providing a relatively dense dot-matrix visual output display.

Input sensors 10 shown in FIG. 1 may be conventional by chosen, designed and installed. For example, with respect to electrical atmospheric detection and plotting apparatus (e.g., the STRIKEFINDER® from Insight Avionics Inc.) may include one or more RF antennas as well as an ambient light photosensor (to control display brightness changes from daylight to night time) and the like. In the case of a GEM application, the input sensors may include temperature sensing thermocouples disposed appropriately to monitor the cylinder head temperature, exhaust gas temperature, turbine inlet gas temperature, and the like. User input switches 12 are also conventionally associated with such apparatus. For example, such input switches may be used to change the range or type of display in an electrical atmospheric discharge sensor/display apparatus. In a GEM application, such switches may be used to enter an engine leaning phase of operation, or to switch between other modes of operation and the like. The data processor 14 may be realized by any conventional digital data processing circuitry. Typically, a micro computer and associated peripheral circuits including, for example, a firmware program memory may be utilized to conventionally realize such data processor 14.

A signal output interface from the data processor 14 supplies display driving data to conventional two-dimensional display driver circuits 16. For example, the two-dimensional display driver circuit 16 may be provided with data from a bit map of a desired dot-matrix display so as to successively energize selected display light output dots along horizontal rows or vertical columns of a two-dimensional row/column dot-matrix display.

The detailed design of input sensors 10, user input switches 12, data processor circuits 14 and two-dimensional display drivers 16 is believed to be well within the ordinary skill of those in the art and thus will not be further described. Plural presently preferred embodiments of the novel two-dimensional surface mounted LED array display 18 shown in FIG. 1 will now be explained in more detail with respect to the remaining FIGURES.

For example, a relatively densely packed dot-matrix display is depicted in FIG. 2. This type of two-dimensional dot-matrix display would be suitable, for example, to display a plan view of electrical atmospheric discharges in the STRIKEFINDER® product from Insight Avionics Inc. mentioned above. Here, each dot of light output in the dot-matrix display is generated by a respectively corresponding LED 20 mounted in a central area of a printed circuit board 22. In this exemplary embodiment, the printed circuit board 22 also includes an aperture 24 for a photosensor (e.g., used to sense ambient light levels and thus provide feedback control to the desired brightness level for the display in different ambient light conditions). Each LED 20 is depicted by its rectangular "footprint" and the cathode end of each LED is denoted by a line across the width of the LED near the cathode end. As those in the art will appreciate, this marking on the drawing of FIG. 2 is merely for convenience in depicting the desired polarity of LED placement in the array.

As can be seen in FIG. 2 (and in the enlargement of FIG. 3), the LEDs 20 of successive rows R1, R2, R3, R4, etc. are orthogonally disposed with respect to one another so as to define a pattern commonly referred to in the brick-laying art as a "herringbone" pattern. Similarly, it will be noted that successive columns C1, C2, C3 . . . are also made up of LEDs that are disposed orthogonally to one another in the herringbone pattern. In the preferred embodiment for use in the STRIKEFINDER® product, row and column connections are effected at +45° and −45° slant angles with respect to the conventional horizontal and vertical directions depicted in FIG. 2. However, as will be appreciated, this still results in orthogonal LED placements in adjacent rows and columns.

Each light output dot from the central portion of each LED is thus organized along rows and columns wherein light output dots from adjacent rows are offset with respect to one another (and likewise, the light output dots of adjacent columns are offset with respect to one another). Of course if the rows and columns are oriented at +45° and −45°, then the dots of light will be aligned between rows and columns. In this manner, although each rectangularly-shaped diode has a length dimension of D, a uniform horizontal and vertical pitch between the centers of dots in the dot-matrix visual display P can be made substantially less than D. For example, in an exemplary embodiment, the "footprint" of each LED is a rectangular shape having a width of 0.031 inch and a length of 0.063 inch. Yet, the spacing P between light dot centers (both horizontally and vertically) in the preferred exemplary herringbone pattern where the diodes are slanted at substantially plus 45° or minus 45° with respect to horizontal and vertical axes) can be made approximately 0.05 inch so as to provide a density of approximately 20 pixels per inch. For example, in the exemplary embodiment of FIG. 2, the whole array can be driven as a truncated 48×48 diode/pixel array so that a relatively large number of pixels can be defined even in a relatively small aircraft cockpit instrument (e.g., which may be as small as approximately 2 inches by 2.5 inches). Peripheral connectors 21 provide connection points 23 for the row/column conductors carried by the lower layers of the PCB 22.

Figure 4:
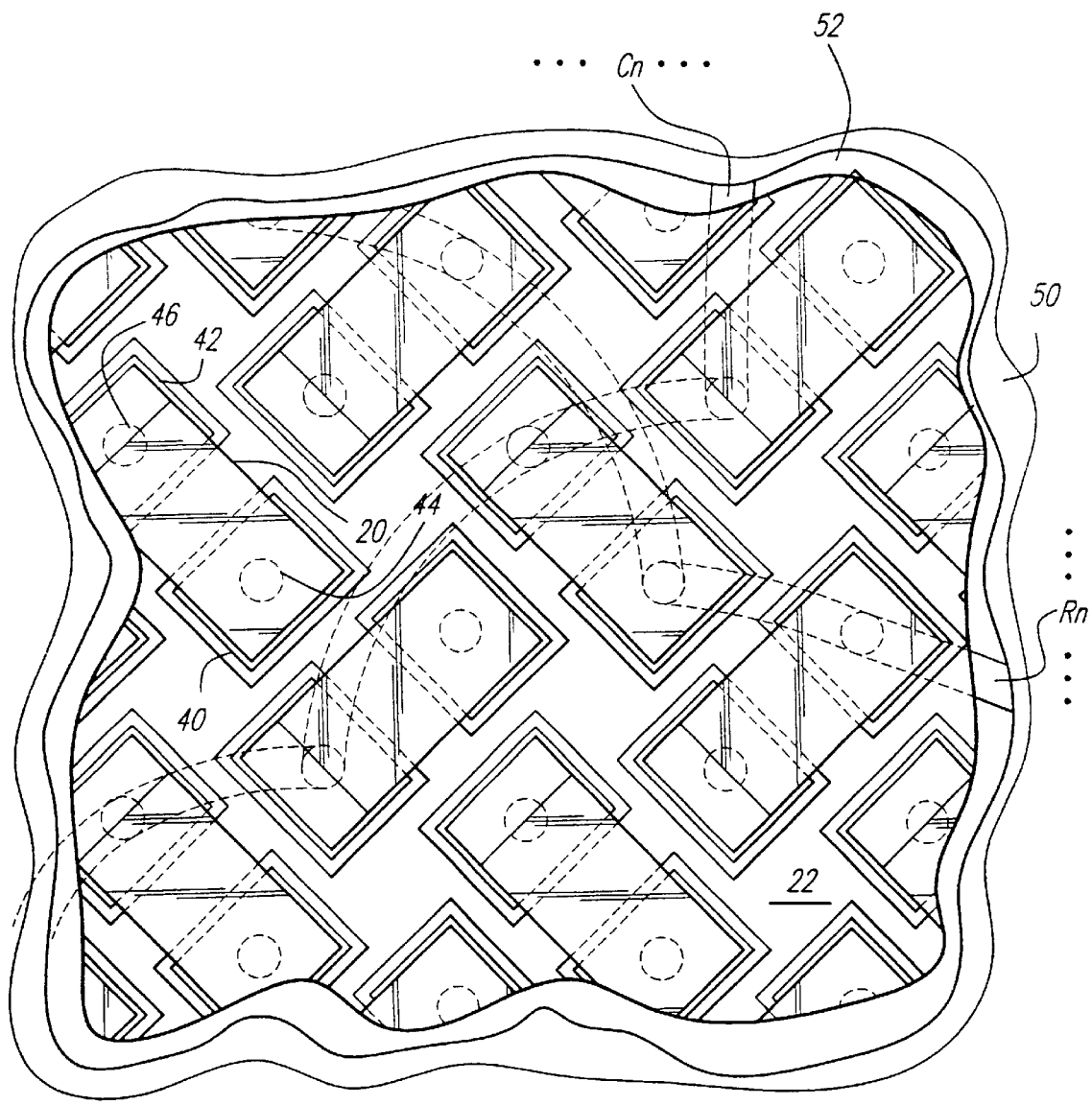

A further enlarged view of a herringbone patterned array of surface mounted LEDs is depicted in FIG. 4 so as to show more of the underlying structure of tinned copper pads, solder mask cutout, anode and cathode vias and the underlying parallel row/column printed conductive patterns of parallel sandwiched printed circuit board structures leading to external peripheral row/column contacts. For example, the visible outline of LEDs 20 is depicted in solid lines as being visible when viewing the top surface of the printed circuit board 22. The underlying tinned copper anode pad 40 and cathode pad 42 are depicted in appropriate solid and dotted lines with respectively included anode via 44 and cathode via 46 depicted in dotted lines. The solder mask cutouts 48 are also depicted in solid and dotted lines as appropriate.

A schematic showing of horizontal row conductors Rn connected to −45° rows of anode vias is shown in another sandwiched plane of PCB 50. Similar +45° columns of conductive traces in yet another parallel plane PCB layer 52 provides connections to Cn to cathode vias of the array. Thus, the printed circuit board 22 actually comprises three layers of sandwiched printed conductors interconnected appropriately by conductively coated vias so as to provide row/column LED activation access for the two-dimensional display drivers 16 of FIG. 1. As will be appreciated, the −45° rows and +45° columns provide aligned light dots in adjacent rows and columns and such non-vertical/non-horizontal dot-matrix arrangement has been the preference for use in prior STRIKEFINDER® products.

It will be noted that the tinned copper pads 40 and 42 extend only slightly beyond the long dimension of each LED 20. In this preferred exemplary embodiment, such extension dimension is only approximately 0.001 inch which is approximately ten times less than the recommended and conventional extension distance of at least about 0.010 inch for surface mount applications. Such a shortened copper pad dimension plus the herringbone pattern of rectangular LEDs permits a relatively dense packing of surface mounted LEDs on PCB 22 thus permitting a reasonable dot-matrix display for an aircraft cockpit instrument.

Figure 3:
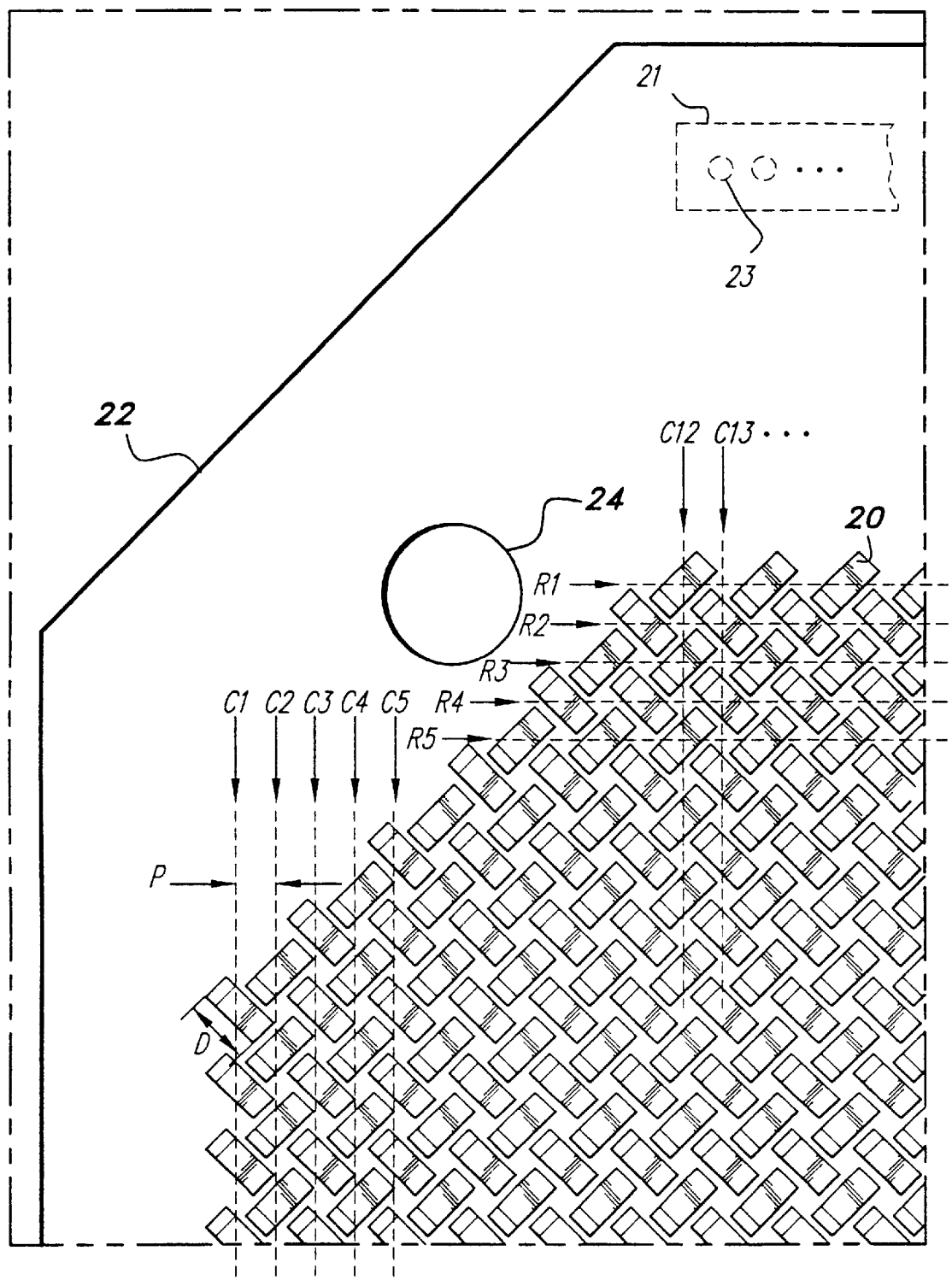
FIGS. 3 and 4 are enlarged partial views of the herringbone two-dimensional array of LEDs depicted in FIG. 2.

FIG. 5 depicts a cross-section of a suitable display assembly utilizing the LED display PCB 22 of FIGS. 2–4. As can be seen in the cross-sectional depiction of FIG. 5, this particular assembly (contained in a suitable conventional housing that is not shown) would include a lens/graticule layer 54 followed by a polarizing filter 56, then the LED display PCB 22 of FIGS. 2–4. The peripheral array connections from the PCB 22 are carried through standoff/spacing connectors 58 to contacts of the driver PCB 60 which includes mounted integrated circuit LED driver circuitry 16. Preferably the polarizing filter 56 circularly polarizes light passing therethrough such that any reflections from the surface of the LED display PCB 22 are blocked (e.g., because they take on a reverse polarization upon reflection). In addition, as explained in more detail below, the surface mounted LED array on PCB 22 is preferably coated with an anti-reflective coating so as to further minimize the amount of light that gets reflected. The combination of this anti-reflective coating and the polarizing filter 56 works to provide a remarkable degree of anti-reflection glare for the LED display assembly of FIG. 5. The anti-glare coated LEDs 20 are of course only schematically depicted in FIG. 5 insofar as numbers and dimensions are concerned.

Figure 6:
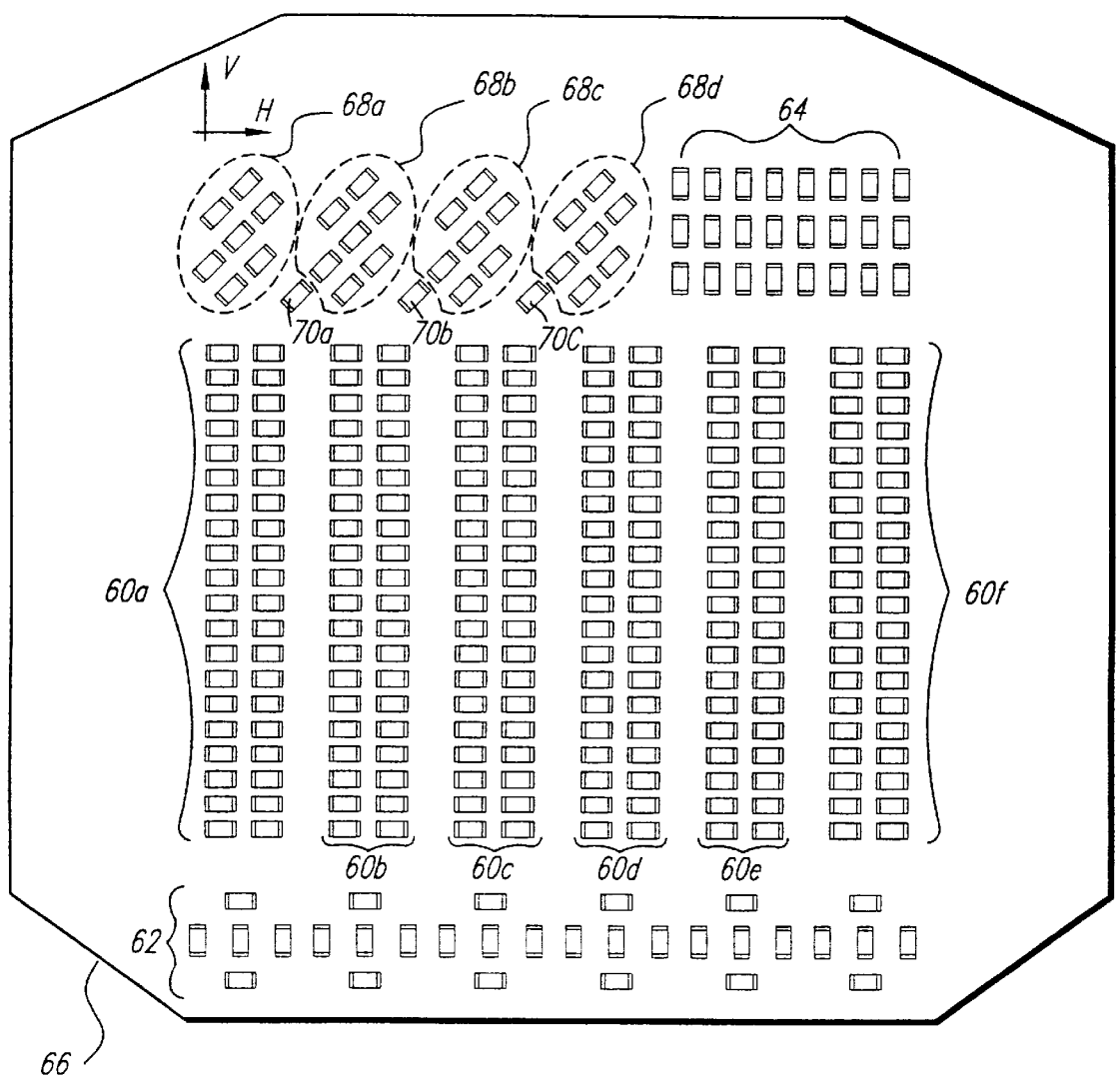
FIG. 6 is an outline of the printed circuit board and surface mounted LED placement for a graphic engine monitor (GEM) embodiment of the invention utilizing segmented character displays.
Figure 7:
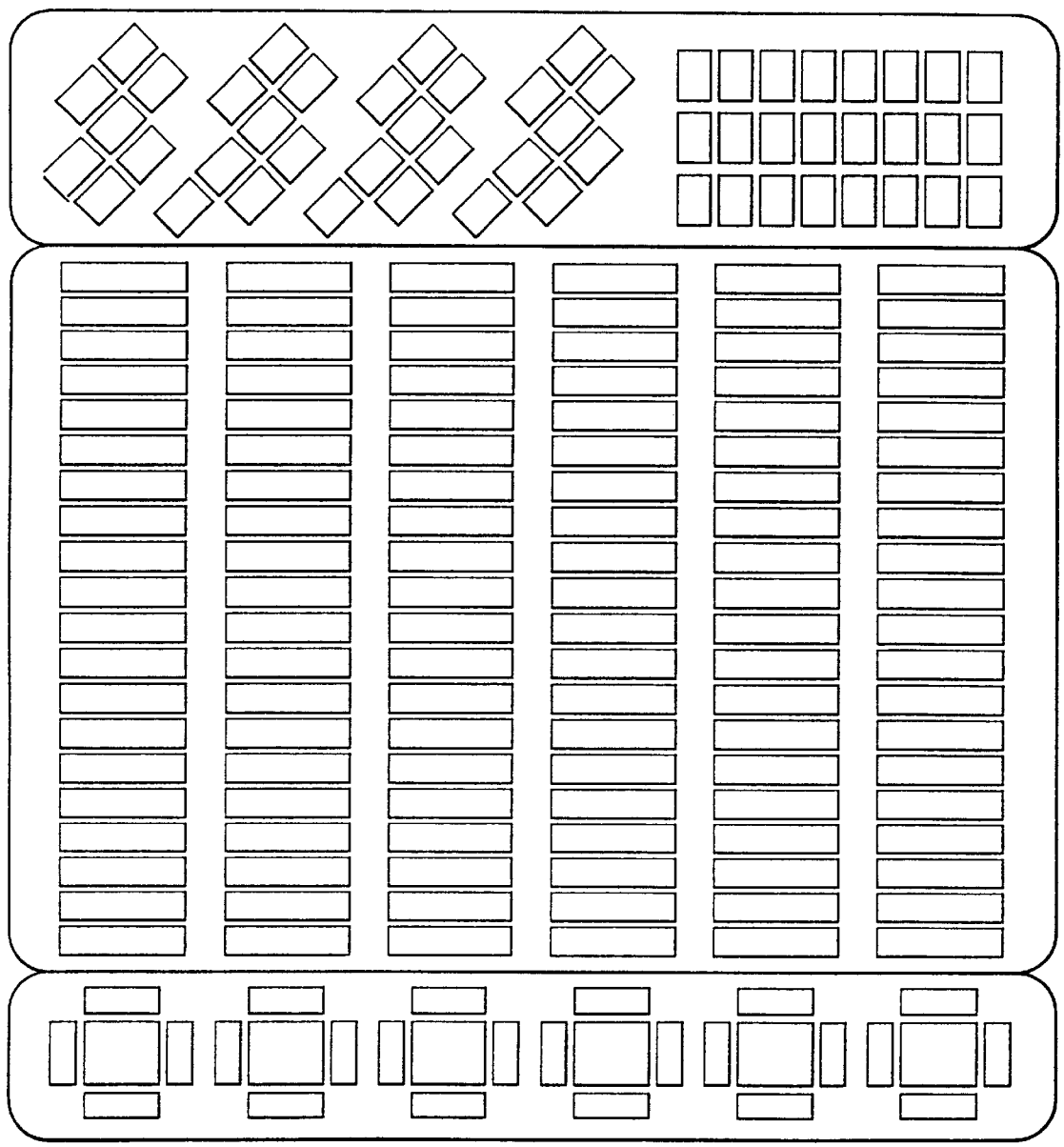
FIG. 7 depicts an LED optical light pipe and diffuser/mask showing LED optical isolation pockets for use in conjunction with the LEDs of FIG. 6.

FIG. 6 depicts a different embodiment of this invention for use with a GEM. Here, a six-cylinder engine monitoring instrument is depicted with columns of paired surface mounted LEDs 60a–60f being used to provide a bargraph representative of cylinder head and/or exhaust gas temperature for each cylinder. As may be seen from FIGS. 7 and 8, these LEDs are actually disposed in an optical light pipe and diffuser/mask sub-assembly of FIG. 7 so as to illuminate selected areas of the character and symbol forming mask shown in FIG. 8. Accordingly, the columns of LED pairs 60a–60f can be selectively illuminated so as to show six respective bargraphs of different height—including an arrow at the top of each bar indicating whether the variable being monitored is increasing or decreasing in magnitude. Annunciator LEDs 62 are depicted along the bottom of the bar graphs so as to annunciate the cylinder number with a lighted outline around each such cylinder number.

Figure 8:
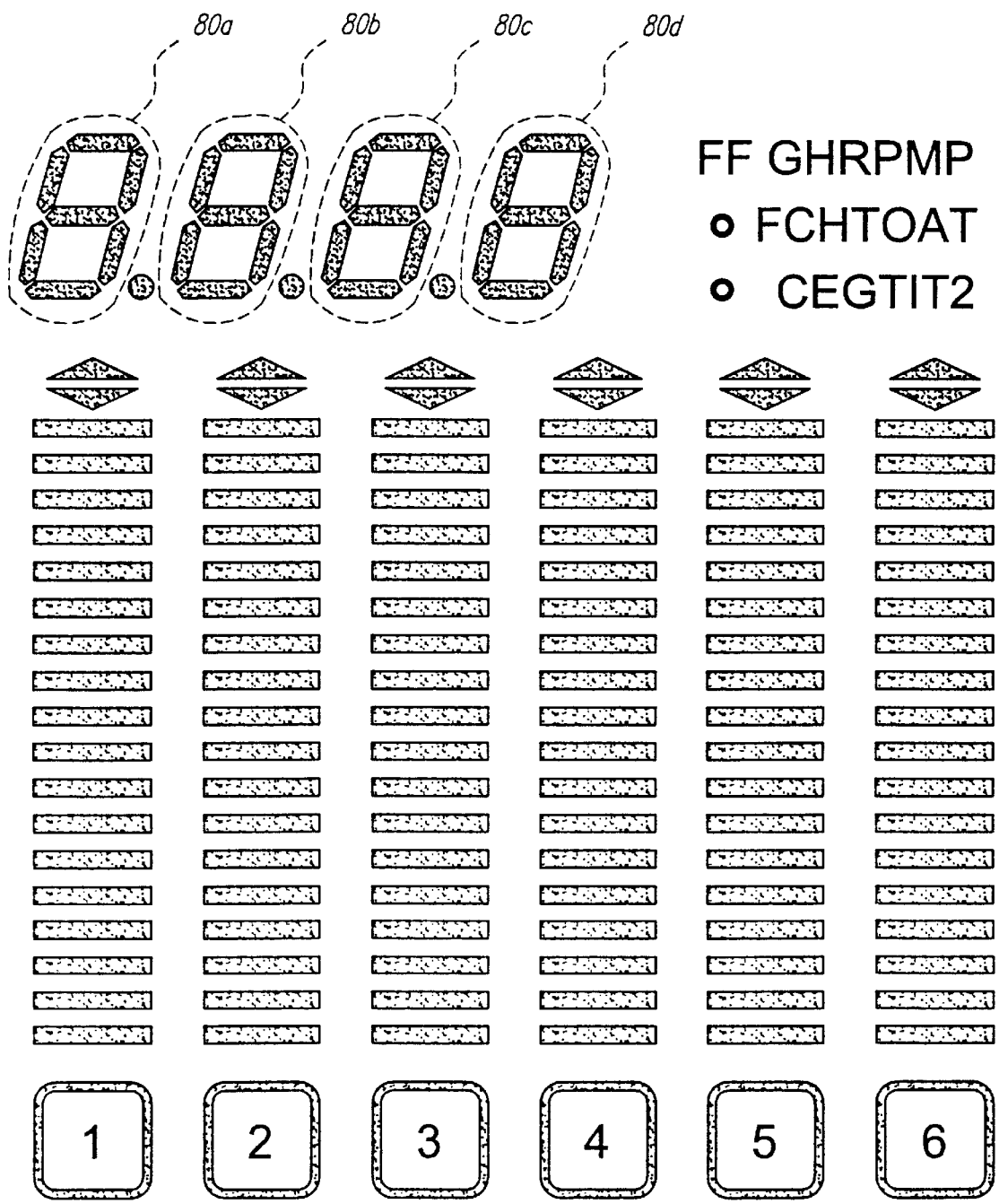
FIG. 8 depicts the character and symbol forming mask located on top of the FIG. 7 sub-assembly to provide the desired bargraph and alphanumeric outputs of a GEM apparatus.

A two-dimensional linear array of LEDs 64 in the upper righthand portion of the printed circuit board 66 can be selectively activated so as to light desired portions of alphanumeric masks as indicated in the upper right portion of FIG. 8.

The slant-arrayed groups of seven LEDs 68a, 68b, 68c and 68d as depicted in FIG. 6 are respectively associated with the seven-segment character masks 80a–80d of FIG. 8. This particular slant-array arrangement of surface mounted LEDs (i.e., in slanted linear groups of two, three and two as one progresses along the vertical character direction V has been found to be particularly advantageous for use with multi-segment display masks (e.g., a seven-segment character display as depicted in FIG. 8). If desired, additional LEDs 70a–70c can be added to the middle linear group of an array so as to provide lighting for a preceding decimal point. As will be appreciated by viewing FIGS. 6–8, the first slant array of two LEDs in each group 68a–68d can be used for selectively illuminating the top and upper left segment of character display. The middle group of three LEDs can be used to selectively illuminate the lower left, middle and upper right segment of the character display. Similarly, the last group of two linearly slanted LEDs can be used to selectively light the bottom and lower right segment of the display mask. In the preferred exemplary embodiment, the slant angle is approximately 45° with respect to the vertical character direction V and the horizontal character direction H.

In the exemplary embodiment of FIGS. 2–4, the drivers are configured to drive a truncated 48×48 dot-matrix array such that the maximum duty cycle for activating LEDs in a given row or column is 1/48. In the exemplary embodiment of FIGS. 6–8, LEDs associated with one of the columns 60a–60f and LEDs vertically above and below are all selectively activated at a given time such that the maximum duty cycle for activation of any given column of LEDs is 1/6.

As can now be appreciated, the light-emitting array of this invention can replace a conventional dot-matrix gas plasma display in the STRIKEFINDER®. It is 40 times as bright (compared to the prior plasma display) for the same input power and has almost unlimited life. It can be constructed in single color or multiple color versions. It's brightness can be changed well over a 1000:1 ratio for daylight and night time viewing. One of its most important features is very high sunlight readability with high display contrast in high ambient light conditions.

The device is constructed from commonly available surface mount LEDs. Although LED arrays have been made by applying chips to ceramic substrates and using wire bond connections, these methods are not nearly as practical. LED chip arrays require exotic hermetic packages to protect the bare chips. They also are difficult to repair. The microscopic bond wires are fragile, and single chips are difficult to replace.

The exemplary LED layouts of this invention as shown in FIGS. 2–4 uniquely alternate the placement angle of adjacent devices to achieve a uniform pitch of pixels or dots on both axes. Monochrome displays use LEDs of all one color. Multicolor displays use either bi-color devices or alternating patterns of different color LEDs. These devices are individually replaceable for repair purposes.

Displays of any practical size are driven in multiplexed fashion and brightness is easily controlled by duty cycle and/or magnitude of the drive current. LEDs respond to pulses of less than 1 $\mu$ sec so brightness control ratios of more than 1000:1 are practical.

Pixel density and therefore LED spacing must be as tight as possible for the best resolution. This tight spacing requires violation of design rules for manufacturing surface mount devices. This complicates manufacturing and reduces yield. Normal designs require the PCB pad to be larger than the contact area of the component and extend well beyond the part in length. This configuration helps the part to self-align during the soldering process. In the exemplary embodiments, the pads are essentially only the same size in length as the component.

In addition, the cardinal rule of "no holes in a component pad" is violated by each and every pad in the embodiment of FIGS. 2–4. Each one has a plated through hole (also called a via) in it. This via is required for the row/column matrix of underlying sandwiched interconnections needed. The disadvantage of this via hole is its tendency to suck away solder from the component during the solder reflow process. This results in poor solder connection yield. This problem is solved with this invention by first filling the plated via holes with a high temperature dielectric material. One material used with success is a solder mask (the typically green coating commonly used on PCBs). This material is a paint like liquid that solidifies when cured. Designed for good adhesion to PCBs and able to withstand the temperature during soldering, it works well.

The exemplary assembly is produced by standard pick and place automated machinery widely used in surface mount production. Each LED is placed in its correct location under program control. The PCB preferably has several other characteristics to facilitate manufacturing. The pads are smaller than usual and typically may require a solder application 2–4 thousands of an inch thicker than normal. To substitute for the self-aligning pads common in this technology a solder mask is used around each pad with only one thousandth of an inch clearance.

The assembly is soldered by standard IR reflow or vapor phase techniques. The exemplary PCB of FIGS. 2–4 has three layers. The top component layer has only pads for LEDs. These pads connect to either the inner layer or bottom layer via plate through holes to the matrix of traces that connect the array in a conventional X-Y fashion. In the exemplary embodiment, these vias are only 0.02 inch in diameter with 0.008 inch diameter plated holes. The traces connecting these vias must be narrow to minimize thermal loss during soldering and especially during repair. A width of 0.01 inch is adequate while 0.015 inch is too wide.

To achieve the best contrast in sunlight, two factors are considered. First, high as possible display brightness. Second, low as possible reflected light from the surface of the display. Contrast ratio is often measured and specified in display applications. This measurement is the ratio of reflected light to emitted light. Reflected light is controlled in the exemplary design in several ways. The entire LED PCB assembly is coated with a quarter-wave anti-reflective coating. Usually applied to lenses, here the entire assembly is coated in a high vacuum chamber. This reduces the reflected light from about 8% to less than 1%. This can improve the contrast ratio by eight times. In addition to the coating, a circularly polarized contrast enhancement filter and lighted graticule are often applied. These elements are also anti-reflective coated to increase contrast and reduce glare.

This technology is also applicable to bargraph display instruments. The bargraph requires a different configuration than the simple dot-matrix display. The LEDs placed on the PCB in bargraph configuration with a light pipe component defining the graphic appearance of the display. Through a light pipe and diffuser/mask, the light is blended into a uniform bar.

A key feature of this display over the plasma display is it includes the ability to be in color. Some configurations have two different color LEDs behind each bar. When used separately or simultaneously, three different colors are available. For example, a red/green pair produces red, green and orange (when used together). By modulating the intensity of the combination, some color tuning may be had.

In the GEM application, bars can be green when temperatures are normal, orange when near limits and red when over the limit. Bars can also blink from one color to another. Numeric displays of the seven-segment type can also be constructed using the disclosed unique layout. To meet packing requirements, the LEDs are mounted at the special angle shown. When used in combination with an appropriate light pipe and diffuser, good numeric displays are obtained.

While the invention has been described with respect to presently preferred exemplary embodiments, those having skill in the art will recognize that many variations and modifications of these exemplary embodiments may be made while yet retaining many of the novel features and advantages of this invention. Accordingly, all such modifications and variations are intended to be included within the scope of the following claims.

What is claimed is:

1. A two-dimensional visual display of rectangularly shaped light-emitting diodes surface-mounted on a printed circuit board, said display comprising:

a printed circuit board having pairs of solder-coated conductive mounting pads, each pair of pads having a respectively corresponding anode and cathode of a rectangular light-emitting diode surface-mounted thereon with reflowed solder connections, each diode providing a dot of output light when activated, said rectangular light-emitting diodes being disposed in a two-dimensional row and column overlapping herringbone pattern array where rectangular diodes in each row are all parallel to one another but are all oblique with respect to diodes in adjacent rows, and such that at least one of the ends of each of the light-emitting diodes in a row is approximately centered with respect to a light-emitting diode in an adjacent row the diodes in each successive row slanting away from those in the other adjacent row or rows.

2. A two-dimensional visual display as in claim 1 wherein said printed circuit board is substantially planar and each pair of said conductive mounting pads is connected through corresponding cathode and anode vias to different respectively corresponding printed conductive circuit anode and cathode connections in different printed board planes substantially parallel to the printed circuit board on which said diodes are mounted.

3. A two-dimensional visual display as in claim 1 wherein said light-emitting diodes are arrayed in a herringbone pattern such that the diodes of one row or column are oriented orthogonally with respect to corresponding diodes in another adjacent row or column.

4. A two-dimensional visual display as in claim 1 wherein light-emitting portions of said diodes in rows and columns are offset with respect to adjacent rows and columns.

5. A two-dimensional visual display as in claim 1 wherein said light-emitting diodes are disposed under a multi-apertured mask representing a segmented character display, said mask including oblong apertures having a longitudinal dimension that is rotationally offset with respect to the longitudinal dimension of an associated rectangular light-emitting diode.

6. A segmented character display as in claim 5 wherein said mask includes seven segment apertures.

7. A segmented character display as in claim 5 wherein each diode can be simultaneously activated.

8. A segmented character display as in claim 5 wherein the long dimension of all rectangular diodes is oriented at a substantial slant angle with respect to both horizontal and vertical character dimensions.

9. A two-dimensional visual display as in claim 1 wherein adjacent light-emitting diodes emit different colors of light and are connected for selective activation to provide different colors of light output for a common display element.

10. A two-dimensional visual display as in claim 9 wherein adjacent differently colored light outputs are co-activated so as to provide light output as a mixture of colors from plural light-emitting diodes.

11. A method of making a two-dimensional visual display of rectangular light-emitting diodes surface-mounted on a printed circuit board, said method comprising:

disposing rectangular light-emitting diodes in a two-dimensional row and column array in an overlapping herringbone pattern, such that at least one of the ends of each one of the light-emitting diodes in a row is approximately centered with respect to a light-emitting diode in an adjacent row, on a printed circuit board having pairs of solder-coated conductive mounting pads, and a surface mounting a light-emitting diode on each said pair of pads using reflowed solder, the diode having an anode mounted to one pad of an associated pair and a cathode mounted to the other pad of the associated pair.

12. A method as in claim 11 wherein said light-emitting diodes are arrayed in said herringbone pattern such that the diodes of one row or column are all oriented orthogonally with respect to all corresponding diodes in an adjacent row or column.

13. A method as in claim 11 wherein said conductive pads extend beyond edges of the light-emitting diodes by a distance that is approximately 0.001 inch.

* * * * *